(12) United States Patent
Ishida

(10) Patent No.: US 7,595,692 B2
(45) Date of Patent: Sep. 29, 2009

(54) AUTOMATIC GAIN CONTROL CIRCUIT

(75) Inventor: Takuma Ishida, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/042,860

(22) Filed: Mar. 5, 2008

(65) Prior Publication Data
US 2008/0218268 A1    Sep. 11, 2008

(30) Foreign Application Priority Data
Mar. 9, 2007    (JP)    ............... 2007-059873

(51) Int. Cl.
*H03G 3/10*    (2006.01)
(52) U.S. Cl. ............ 330/279; 330/129; 330/278
(58) Field of Classification Search ........ 330/129, 330/278, 279; 455/127.2
See application file for complete search history.

(56) References Cited
U.S. PATENT DOCUMENTS
4,360,787 A * 11/1982 Galpin ................ 330/284
6,977,550 B2 * 12/2005 Ishida et al. ............. 330/279
7,015,759 B2 *  3/2006 Ishida et al. ............. 330/279
7,411,456 B2 *  8/2008 Ishida ................... 330/279

FOREIGN PATENT DOCUMENTS
JP    2004-274571    9/2004
JP    2005-057595    3/2005
JP    2006-067012    3/2006

* cited by examiner

*Primary Examiner*—Khanh V Nguyen
(74) *Attorney, Agent, or Firm*—McDermott Will & Emery LLP

(57) ABSTRACT

An automatic gain control circuit for controlling the gain of a variable gain amplifier block includes a count control signal generating block, an up-down counter, a gain control signal generating block, and a downcount clock signal generating block. The up-down counter upcounts an upcount clock signal or downcounts a downcount clock signal according to a count control signal generated by the count control signal generating block. The gain control signal generating block generates a gain control signal corresponding to a count value of the up-down counter. The downcount clock signal generating block generates a downcount clock signal whose frequency corresponds to the count value of the up-down counter.

10 Claims, 18 Drawing Sheets

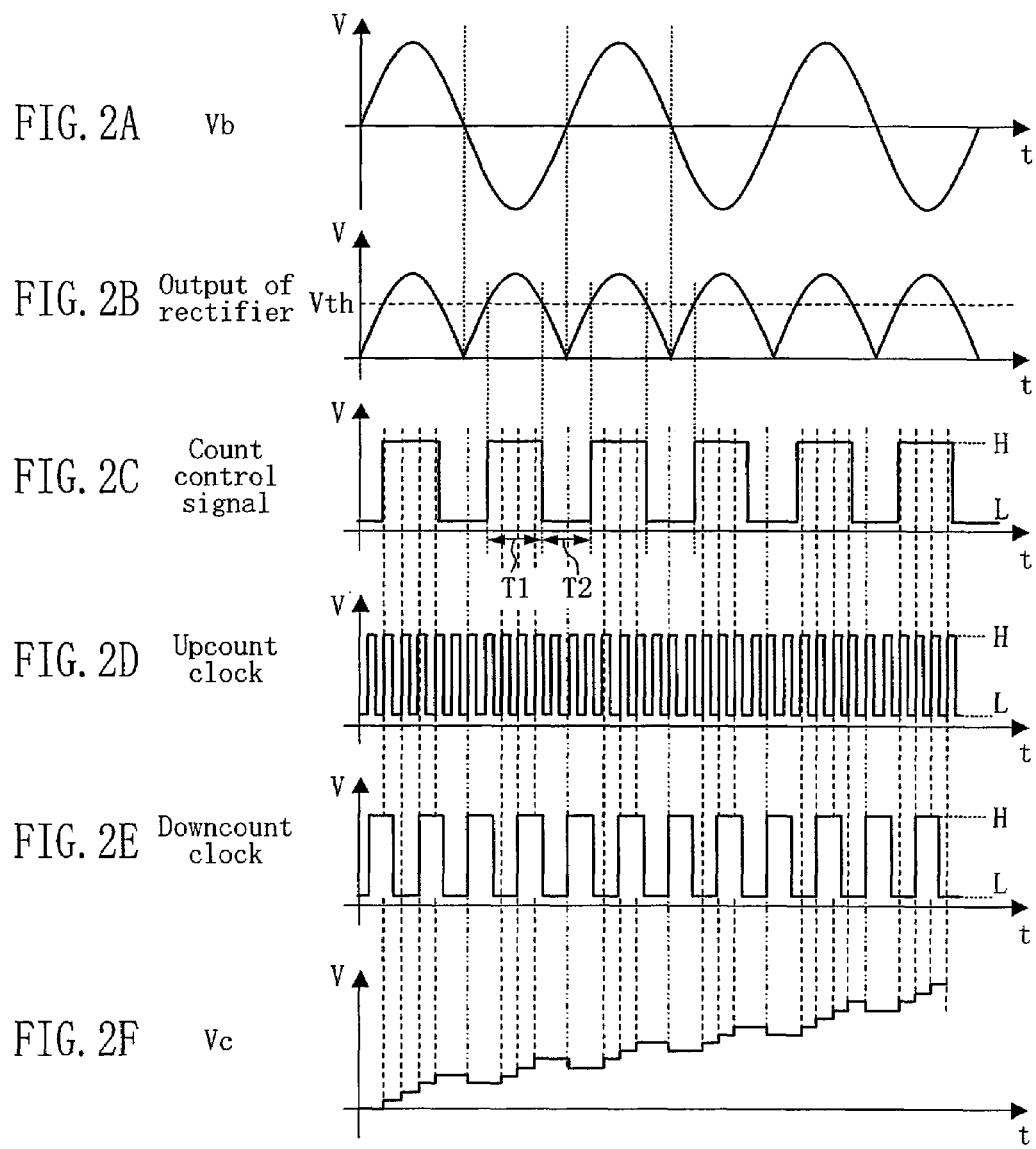

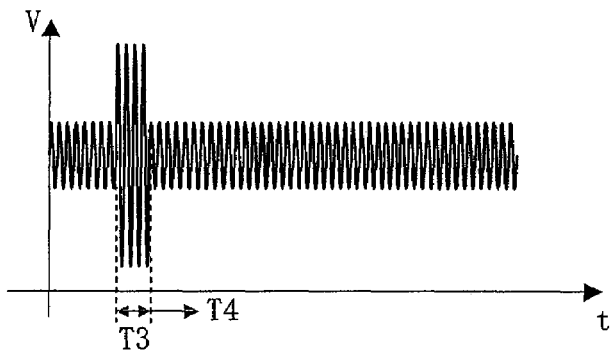
FIG. 3A  Va
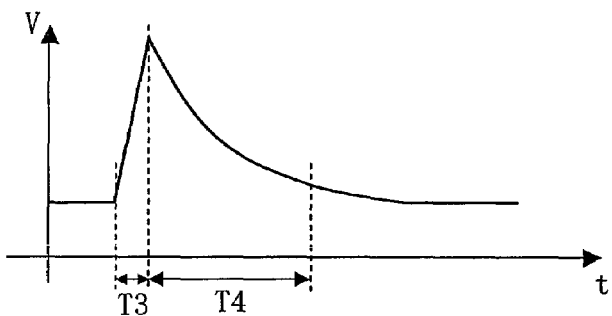
FIG. 3B  Vc
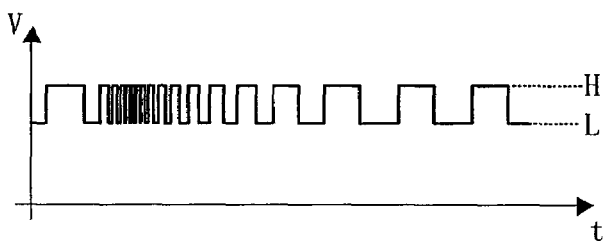
FIG. 3C  Downcount clock
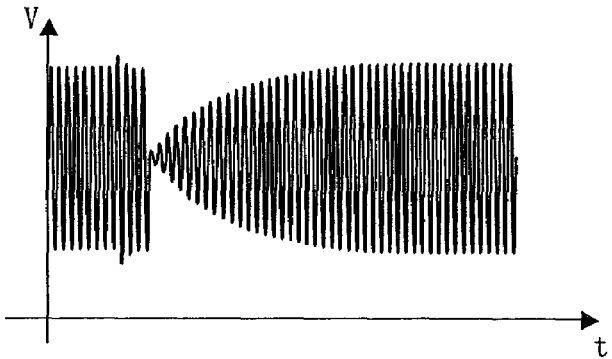
FIG. 3D  Vb

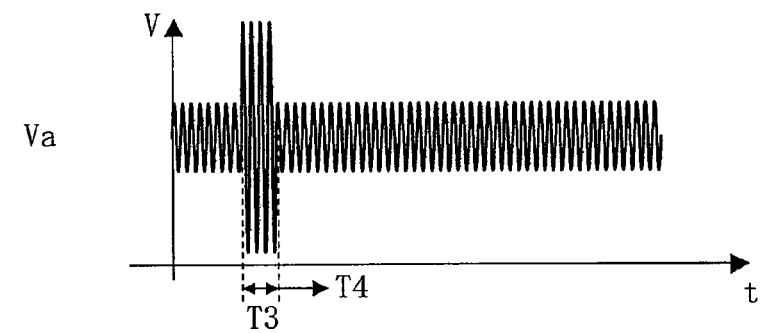
FIG. 5A  Va
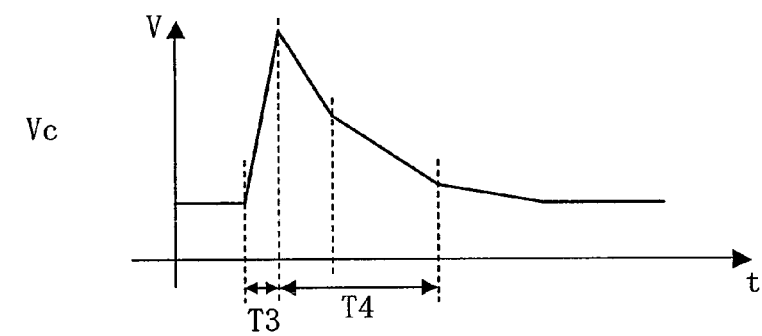
FIG. 5B  Vc
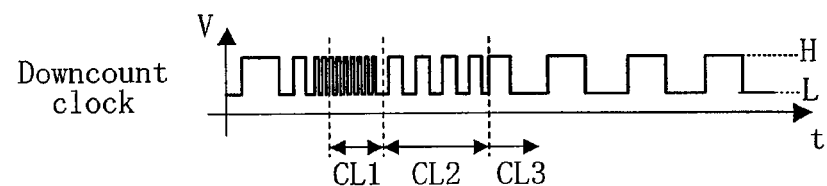
FIG. 5C  Downcount clock
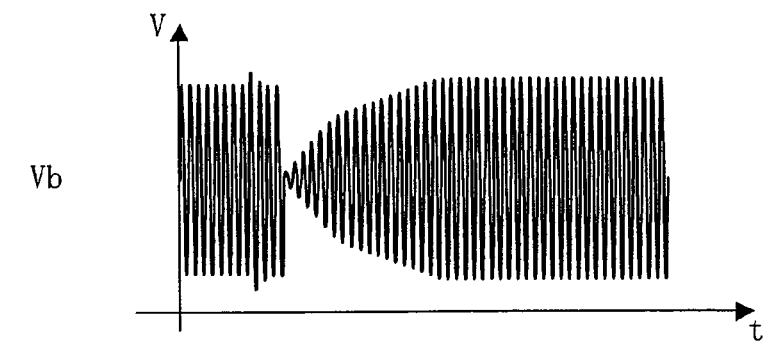
FIG. 5D  Vb FIG. 6A Downcount clock
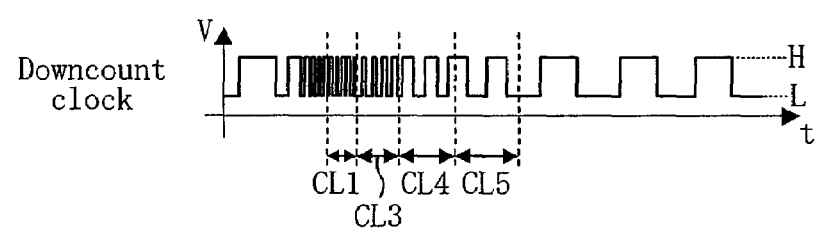
FIG. 6B Vb
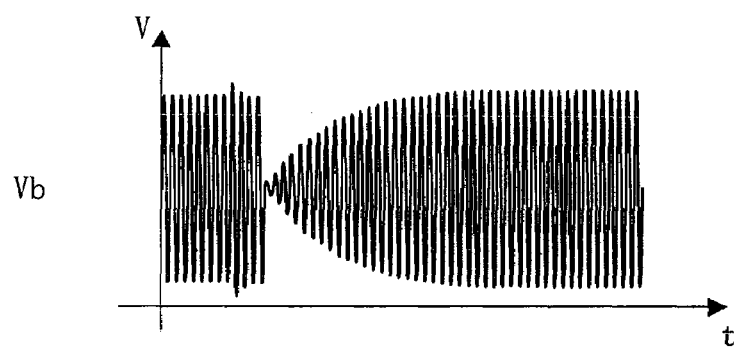

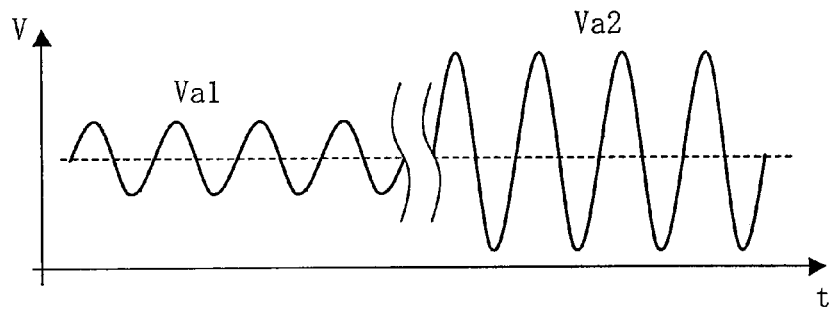
FIG. 9A  Va
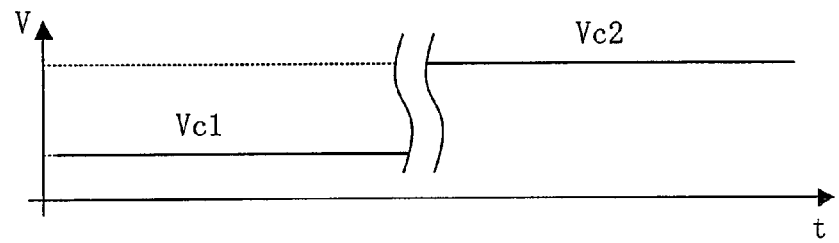
FIG. 9B  Vc
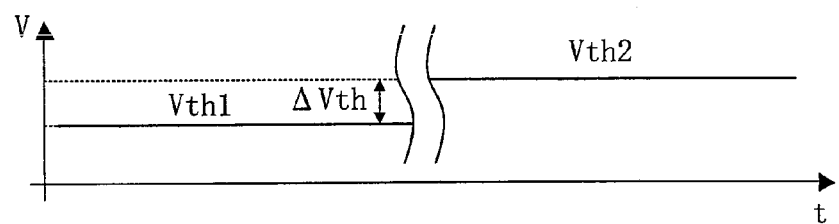
FIG. 9C  Vth
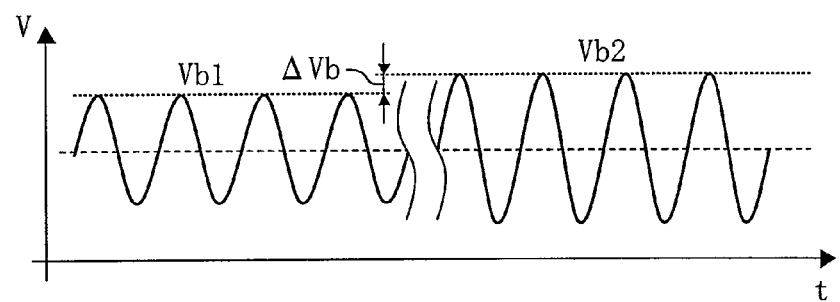
FIG. 9D  Vb FIG. 12A  Va
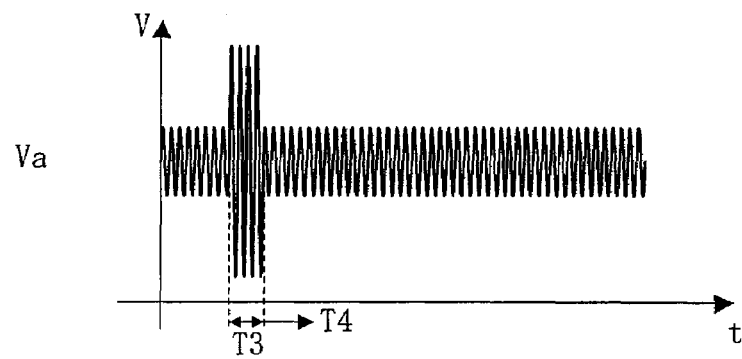
FIG. 12B  Vc and Vd
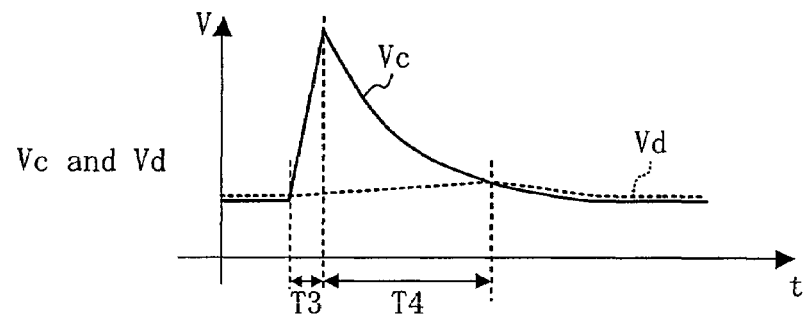
FIG. 12C  First downcount clock
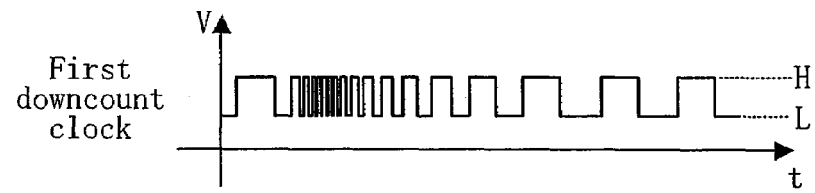
FIG. 12D  Second downcount clock
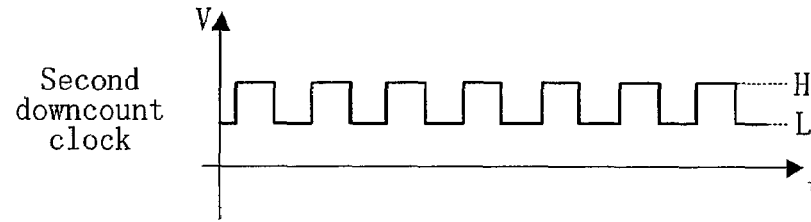
FIG. 12E  Vb
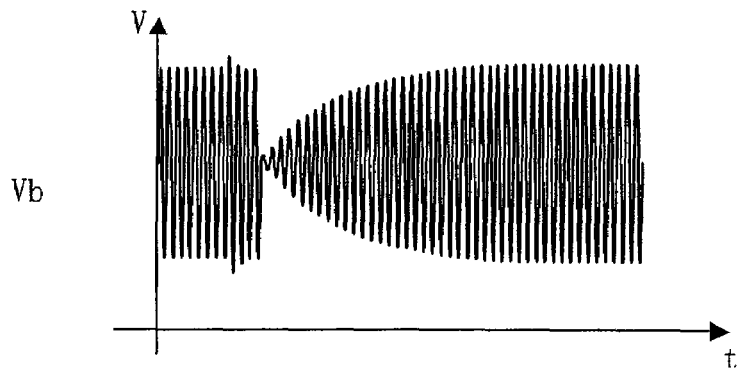

Input signal

Gain control signal

Upcount clock

Downcount clock

Output signal

AUTOMATIC GAIN CONTROL CIRCUIT

CROSS REFERENCE TO RELATED APPLICATION

The disclosure of Japanese Patent Application No. 2007-059873 filed on Mar. 9, 2007 including specification, drawings and claims is incorporated herein by reference in its entirety.

BACKGROUND OF THE INVENTION

1. Field of the Invention

The present invention relates to an automatic gain control circuit, provided in a communication system or in an audio system, for controlling the gain of a variable gain amplifier circuit in accordance with the amplitude of an input signal.

2. Description of the Related Art

In a communication system, an audio system or the like, an automatic gain control (AGC) circuit for controlling the gain of an amplifier circuit in accordance with the amplitude of an input signal typically employs an integrator using a capacitor. The capacitor required in such an integrator, however, has a quite large capacitance value, and it is thus difficult to incorporate the capacitor into a semiconductor integrated circuit.

AGC circuits that do need to use capacitors and thus can be easily incorporated into semiconductor integrated circuits include one disclosed by the present inventors, for example (see, e.g., Patent Document 1). In the conventional AGC circuit, as shown in FIG. 21, for example, a rectifier 112 and a voltage comparator 113 generate a count control signal corresponding to the output of a variable gain amplifier block 111. The count control signal makes an up-down counter 114 count up or count down, and a digital-to-analog converter 115 and an amplifier 116 produce a gain control signal according to the count value of the up-down counter 114. FIG. 21 shows an example in which the AGC circuit is set so that as the count value of the up-down counter 114 becomes smaller, the gain of the variable gain amplifier block 111 is increased.

When the level of a signal input to the variable gain amplifier block 111 is raised to cause the output of the variable gain amplifier block 111 to exceed the level of a set threshold value Vth, the up-down counter 114 counts up to thereby reduce the gain of the variable gain amplifier block 111. On the other hand, when the output of the variable gain amplifier block 111 does not exceed the level of the set threshold value Vth, the up-down counter 114 does not count up but counts down to thereby increase the gain of the variable gain amplifier block 111.

[Patent Document 1] Japanese Laid-Open Publication No. 2004-274571

Nevertheless, the conventional AGC circuit has the following drawbacks. When a signal having a waveform shown in FIG. 22A is input, the up-down counter 114 counts up in a time period T3 in which the input signal level rises sharply. This causes the voltage of the gain control signal to be increased as shown in FIG. 22B, so that the gain of the variable gain amplifier block 111 is reduced so as to maintain the original signal level. Then, when the input signal level suddenly drops in a time period T4, the up-down counter 114 counts down to lower the voltage of the gain control signal, thereby increasing the gain of the variable gain amplifier block 111 so as to maintain the original signal level.

However, if the signal level is put back to the same level in an instant, discomfort in terms of audibility is caused because realism and perspective are lost. In general, it is desirable that an attack operation for lowering a high signal level be performed quickly, but if a recovery operation for putting a lowered signal level back to the original level is performed too quickly, discomfort increases. Thus, as shown in FIGS. 22C and 22D, the frequency of a downcount clock is set lower than that of an upcount clock so that the recovery operation is performed slowly.

In the conventional AGC circuit, however, when a signal having a waveform such as shown in FIG. 22A is input, the output signal changes as shown in FIG. 22E, in which the amplitude varies linearly during the recovery operation. In addition, when the recovery operation is completed and the amplitude becomes constant, the amplitude stops varying suddenly. This produces a problem in that great discomfort occurs in terms of audibility.

SUMMARY OF THE INVENTION

It is therefore an object of the present invention to solve the above problems and realize an automatic gain control circuit which does not need an integrator using a capacitor and which is more excellent in terms of audibility.

Specifically, a first aspect of the invention is directed to an automatic gain control circuit for generating a gain control signal for controlling the gain of a variable gain amplifier block in accordance with an output of the variable gain amplifier block, and the automatic gain control circuit includes: a count control signal generating block for generating a count control signal according to the output of the variable gain amplifier block; an up-down counter for upcounting an upcount clock signal or downcounting a downcount clock signal according to the count control signal; a gain control signal generating block for generating the gain control signal corresponding to a count value of the up-down counter; and a downcount clock signal generating block for generating the downcount clock signal whose frequency corresponds to the count value of the up-down counter.

In the first inventive automatic gain control circuit, the gain control signal varies with time in a smooth curve during a recovery operation. The output of the variable gain amplifier block thus changes smoothly during the recovery operation, thereby achieving the automatic gain control circuit that causes no discomfort in terms of audibility.

A second aspect of the invention is directed to an automatic gain control circuit for generating a gain control signal for controlling the gain of a variable gain amplifier block in accordance with an output of the variable gain amplifier block, and the automatic gain control circuit includes: a count control signal generating block for generating a first count control signal according to the output of the variable gain amplifier block; a first up-down counter for upcounting a first upcount clock signal or downcounting a first downcount clock signal according to the first count control signal; a second up-down counter for upcounting a second upcount clock signal or downcounting a second downcount clock signal according to a second count control signal; a gain control signal generating block for generating the gain control signal and the second count control signal in accordance with a count value of the first up-down counter and a count value of the second up-down counter; and a downcount clock signal generating block for generating the first downcount clock signal whose frequency corresponds to a difference between the count value of the first up-down counter and the count value of the second up-down counter.

The second inventive automatic gain control circuit enables the gain control signal to vary smoothly during a recovery operation. In addition, since the gain control signal generating block for generating the gain control signal and the second count control signal in accordance with the count value of the first up-down counter and the count value of the second up-down counter is provided, the second inventive automatic gain control circuit allows the responsiveness of the gain control signal to change according to variation in the input signal. Thus the automatic gain control circuit that produces no discomfort in terms of audibility is achieved.

BRIEF DESCRIPTION OF THE DRAWINGS

FIGS. 2A to 2F are graphs indicating signal waveforms from components in the basic operation of the AGC circuit according to the first embodiment of the invention.

FIGS. 3A to 3D are graphs indicating signal waveforms from components in the AGC circuit according to the first embodiment of the invention.

FIGS. 5A to 5D are graphs indicating signal waveforms from components in the AGC circuit according to the first modified example of the first embodiment of the invention.

FIGS. 6A and 6B are graphs indicating signal waveforms from components in the AGC circuit according to the first modified example of the first embodiment of the invention.

FIGS. 9A to 9D are graphs indicating signal waveforms from components in the AGC circuit according to the second modified example of the first embodiment of the invention.

FIGS. 12A to 12E are graphs indicating signal waveforms from components in the AGC circuit according to the second embodiment of the invention.

DETAILED DESCRIPTION OF THE INVENTION

First Embodiment

Figure 1:
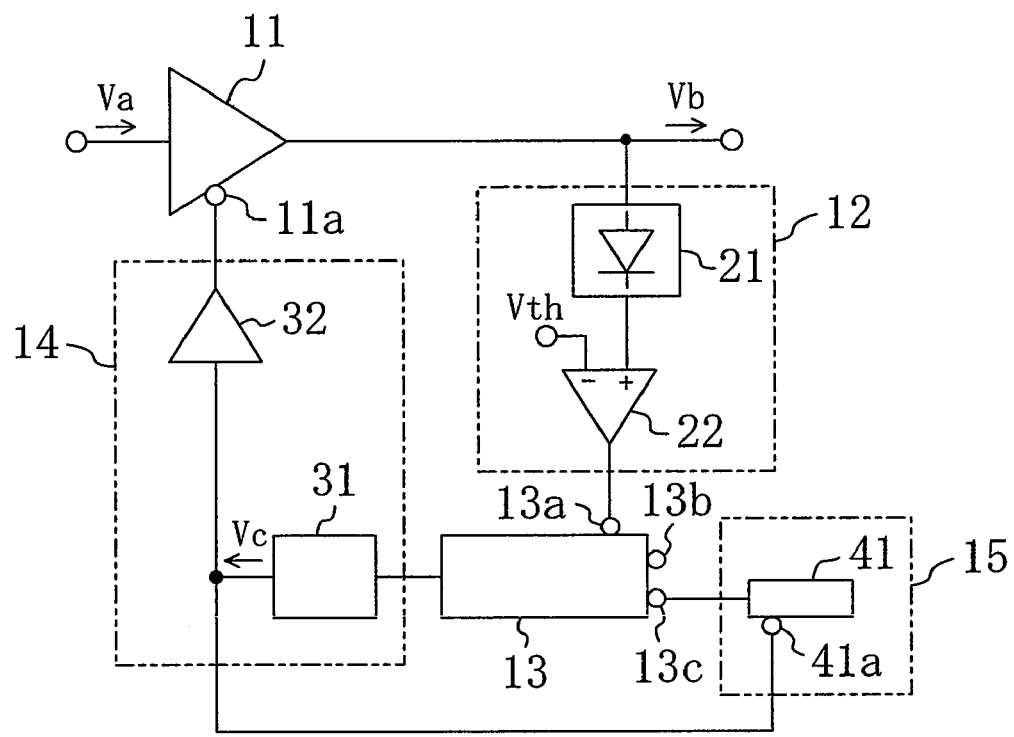
FIG. 1 is a block diagram illustrating an AGC circuit according to a first embodiment of the invention.

A first embodiment of the invention will be described with reference to the accompanying drawings. FIG. 1 illustrates the circuit configuration of an automatic gain control (AGC) circuit according to the first embodiment of the invention. As shown in FIG. 1, in the AGC circuit of the first embodiment, the gain of a variable gain amplifier block 11 is controlled in accordance with the value of an input signal Va. The gain of the variable gain amplifier block 11 varies according to a gain control signal applied to a gain control terminal 11a. An output signal Vb from the variable gain amplifier block 11 is input to a count control signal generating block 12. The count control signal generating block includes a rectifier 21 for detecting and rectifying the output signal of the variable gain amplifier block 11, and a threshold voltage comparator 22 for comparing the output of the rectifier 21 with a threshold voltage.

The output of the count control signal generating block 12 is input to a count control terminal 13a of an up-down counter 13. When the voltage of the count control signal input to the count control terminal 13a is at the high level, the up-down counter 13 counts up in accordance with an upcount clock input to an upcount clock terminal 13b. When the level of the voltage of the count control signal is low, the up-down counter 13 counts down according to a downcount clock input to a downcount clock terminal 13c.

The count value of the up-down counter 13 is converted to a gain control signal for controlling the gain of the variable gain amplifier block 11 by a gain control signal generating block 14. The gain control signal generating block 14 includes a digital-to-analog (D/A) converter 31 for converting the count value of the up-down counter 13 to a voltage, and a gain control signal amplifier 32 for amplifying the output of the D/A converter 31.

The upcount clock and the downcount clock are input to the upcount clock terminal 13b and the downcount clock terminal 13c, respectively, of the up-down counter 13. The upcount clock is a clock signal of a fixed frequency generated by an upcount clock generating block (not shown). The upcount clock generating block may have any structure, so long as a clock signal of a certain frequency is obtainable.

The downcount clock is generated by a downcount clock generating block 15. The downcount clock generating block 15 produces a clock pulse having a frequency corresponding to the count value of the up-down counter 13. The downcount clock generating block 15 of this embodiment is a voltage controlled oscillator (VCO) 41 which is controlled by the output of the D/A converter 31.

In this embodiment, the variable gain amplifier block 11 has a characteristic in which the gain thereof decreases, as the voltage applied to the gain control terminal 11a is increased, while the VCO 41 has a characteristic in which the oscillation frequency thereof increases, as the voltage applied to an oscillation control terminal 41a is raised.

Hereinafter, it will be described how the AGC circuit according to the first embodiment operates. First, a basic gain control operation will be discussed.

FIGS. 2A to 2F show the waveforms of the output Vb of the variable gain amplifier block 11, of the output of the rectifier 21, of the output of the count control signal generating block 12, of the upcount clock, of the downcount clock, and of the output Vc of the D/A converter 31, respectively. For the sake of simplicity, it is assumed that each of the upcount clock and the downcount clock is a clock pulse whose frequency is constant and that the output Vb is a sine wave.

The output Vb of the variable gain amplifier block 11 having a waveform such as shown in FIG. 2A is rectified by the rectifier 21 so as to have a pulsating waveform such as shown in FIG. 2B, and is then input to the threshold voltage comparator 22. The threshold voltage comparator 22 compares the output of the rectifier 21 with a predetermined threshold voltage Vth and outputs a pulse waveform such as shown in FIG. 2C. The output of the count control signal generating block 12 is input to the count control terminal 13a of the up-down. counter 13. Hence as the level of the output Vb of the variable gain amplifier block 11 is raised, the length of time in which the voltage of the count control terminal 13a is at the high level is increased.

The upcount clock terminal 13b of the up-down counter 13 receives the upcount clock shown in FIG. 2D, while the downcount clock terminal 13c receives the downcount clock shown in FIG. 2E.

In a time period T1 in which the level of the voltage of the count control terminal 13a is high, the up-down counter 13 counts up in accordance with the upcount clock. On the other hand, in a time period T2 in which the level of the voltage of the count control terminal 13a is low, the up-down counter 13 counts down according to the downcount clock. The up-down counter 13 thus repeats the upcounting and the downeounting, whereby the output Vc of the D/A converter 31 has a waveform shown in FIG. 2F.

As the output Vc of the D/A converter 31 becomes high, the gain of the variable gain amplifier block 11 and hence the level of the output signal Vb drop, causing the downcounting to proceed. Consequently, the output Vc of the D/A converter 31 lowers, which then leads to an increase in the gain of the variable gain amplifier block 11. This increase in the gain causes the level of the output signal Vb to go up, thereby making the upcounting proceed. By repeating this, the output signal Vb of the variable gain amplifier block 11 converges to a certain level.

As shown in FIGS. 2D and 2E, if the frequency of the downcount clock is set lower than that of the upcount clock, the upcounting goes fast, while the downcounting goes slowly. Therefore, an attack operation for putting the raised level of the output signal Vb back to the original level is performed quickly, while a recovery operation for putting the lowered level of the output signal Vb back to the original level is conducted slowly. For instance, if the frequency of the upcount clock is set to 250 KHz, and the frequency of the downcount clock is set to 250 Hz, then the time required for the attack operation is 1 millisecond, and the time required for the recovery operation is 1 second.

In the AGC circuit according to this embodiment, the downcount clock is supplied from the VCO 41 that is controlled by the output Vc of the D/A converter 31, and the higher the voltage of the output Vc of the D/A converter 31, the higher the frequency of the downcount clock. Hence, as the gain of the variable gain amplifier block 11 is lowered, variation in the gain of the variable gain amplifier block 11 in the recovery operation is increased.

Suppose a case in which the input signal Va to the variable gain amplifier block 11 is a signal whose amplitude sharply increases in a time period T3 and suddenly decreases in a time period T4 as shown in FIG. 3A. In this case, as shown in FIG. 3B, the output Vc of the D/A converter 31 is raised in the time period T3, and an attack operation for reducing the gain of the variable gain amplifier block 11 is conducted. Since the attack operation is carried out quickly, the output signal Vb hardly varies in the time period T3 as shown in FIG. 3D.

On the other hand, when the amplitude of the input signal Va rapidly decreases in the time period T4, the voltage of the output Vc of the D/A converter 31 drops, such that a recovery operation for increasing the gain of the variable gain amplifier block 11 is performed. In the early stages of the recovery operation, since the voltage of the output Vc of the D/A converter 31 is high, the downcount clock generated by the VCO 41 has high frequencies as shown in FIG. 3C. This causes the downcounting to go fast, which increases the rate of decrease of the output Vc of the D/A converter 31, resulting in a significant increase in the gain of the variable gain amplifier block 11. However, when the output Vc of the D/A converter 31 increases, the frequency of the downcount clock decreases as shown in FIG. 3C, so that the speed of the downcounting and thus the rate of decrease of the output Ve of the D/A converter 31 are lowered. This allows the output signal Vb to be restored in a smooth curve as shown in FIG. 3D rather than in a straight line. Thus, the AGC circuit, when used, e.g., in audio signal processing, reduces discomfort in terms of audibility.

First Modified Example of the First Embodiment

Figure 4:
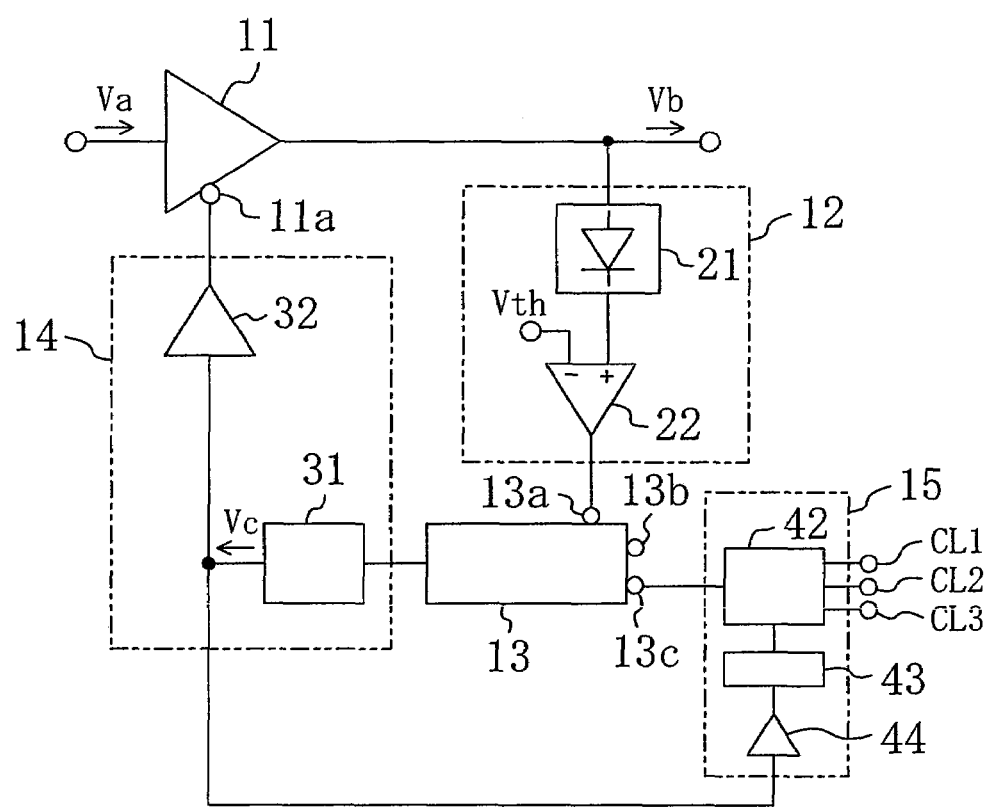
FIG. 4 is a block diagram illustrating an AGC circuit according to a first modified example of the first embodiment of the invention.

In the first embodiment, although the VCO is used as the downcount clock generating block 15, other method may be adopted to produce the downcount clock. For instance, a configuration such as shown in FIG. 4 may be employed, in which a clock signal selector switch 42 switches among clock pulses supplied from a clock pulse generating block (not shown) which produces the clock pulses having different frequencies. In FIG. 4, the clock signal selector switch 42, which is a three-input one-output changeover switch, is controlled by the output Vc of the D/A converter 31. Specifically, the output Vc of the D/A converter 31 is amplified by an amplifier 44, and then the amplified output is converted to digital data by an analog-to-digital (A/D) converter 43, thereby producing a control signal for the clock signal selector switch 42.

FIG. 5 shows operation performed in the case of this configuration. When the level of the input signal Va rises in a time period T3, the output Vc of the D/A converter 31 is increased. This causes the clock signal selector switch 42 to select CL1 having a high frequency. Therefore, if the level of the input signal Va sharply decreases in a time period T4, the up-down counter 13 counts down in accordance with CL1 having a high frequency. The output Vc of the D/A converter 31 thus suddenly drops, so that the gain of the variable gain amplifier block 11 and hence the amplitude of the output signal Vb increase rapidly. With an increase in the output Vc of the D/A converter 31, the clock signal selector switch 42 selects CL2 whose frequency is lower than that of CL1. The selection of CL2 results in a reduction in the speed of the downcounting and thus a decrease in the rate of change of the output Vc of the D/A converter 31. The rate of change of the output signal Vb also decreases accordingly. When the output Vc of the D/A converter 31 is increased further, the clock signal selector switch 42 selects CL3 whose frequency is lower than that of CL2. As a result, the rate of change of the output Vc of the D/A converter 31 is lowered further.

In this case, since the downcount clock changes stepwise, changes in the waveform during the recovery operation become rough, however, the effect of reducing discomfort in terms of audibility is sufficiently achievable. Also, although the frequency of the downcount clock is changed in three levels in FIG. 4, the number of switching levels may be increased as shown in FIGS. 6A and 6B to thereby allow the waveform to change more finely during the recovery operation.

Figure 7:
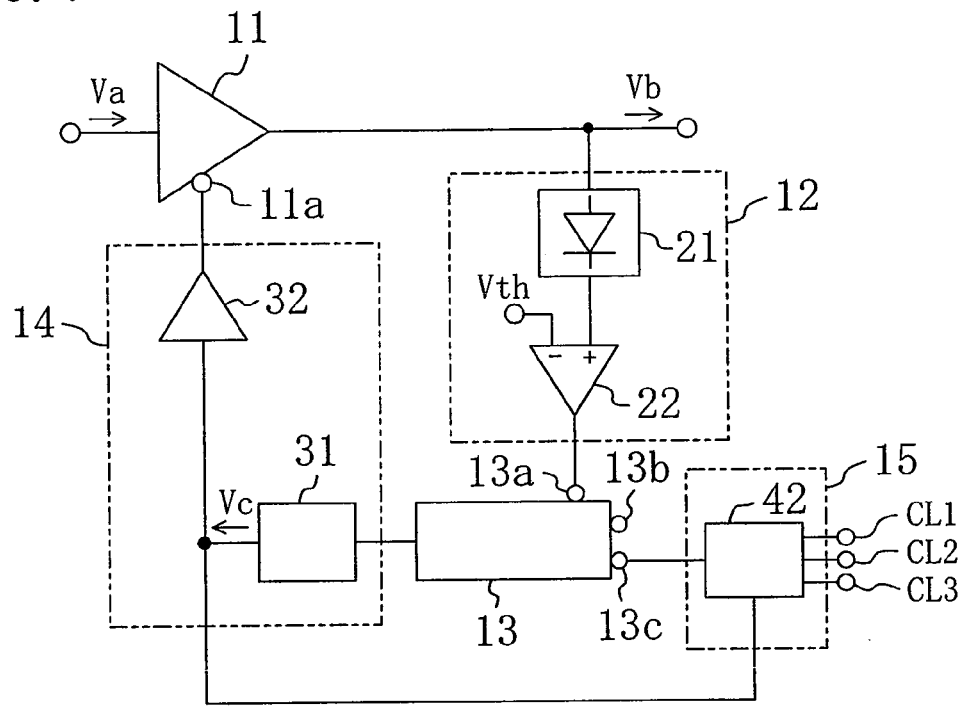
FIG. 7 is a block diagram illustrating another AGC circuit according to the first modified example of the first embodiment of the invention.

In this modified example, the control signal for the clock signal selector switch is produced by subjecting the output of the D/A converter to the A/D conversion. Nevertheless, as shown in FIG. 7, the clock signal selector switch 42 may be directly connected with the up-down counter 13.

Furthermore, since it is sufficient if the frequency of the downcount clock is changed according to the count value of the up-down counter, a configuration may be adopted in which the oscillation frequency itself of the clock pulse generating block is changed.

Second Modified Example of the First Embodiment

Figure 8:
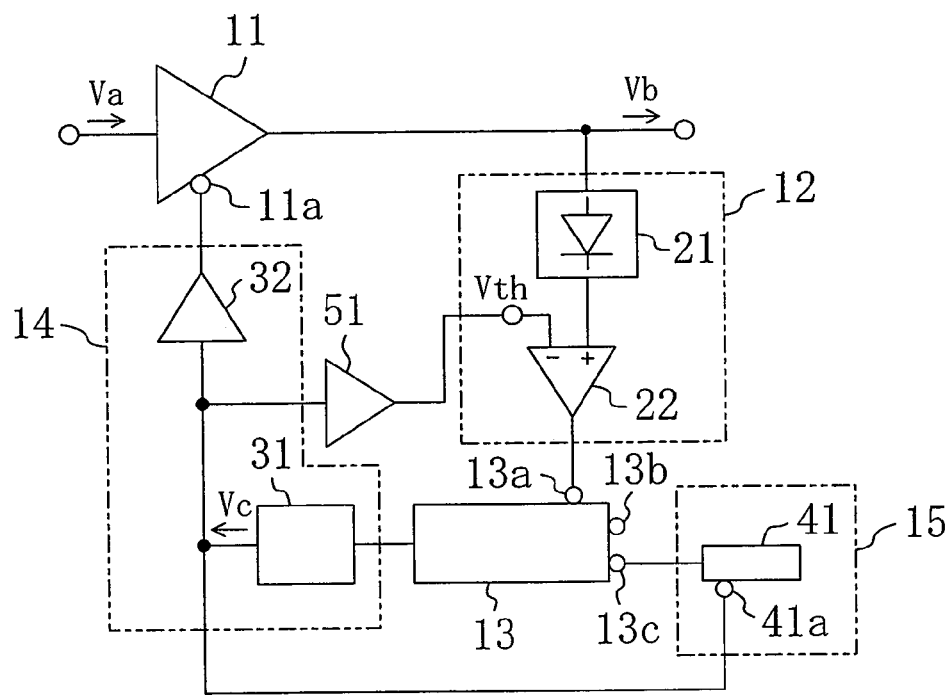
FIG. 8 is a block diagram illustrating an AGC circuit according to a second modified example of the first embodiment of the invention.

In the exemplary case described in the first embodiment, the threshold voltage Vth for generating the count control signal is a constant voltage, however, another configuration may be adopted in which the threshold voltage is generated based on the output Vc of the D/A converter 31. For example, as shown in FIG. 8, the output Vc of the D/A converter 31 may be changed to a predetermined voltage by a threshold voltage changer 51, which is a voltage amplifier, and then the predetermined voltage may be input to the threshold voltage comparator 22. This configuration enables the threshold voltage Vth for switching between the upcount operation and the downcount operation of the up-down counter 13 to be changed in accordance with the magnitude of the input signal Va. It is thus possible to change the magnitude of the output signal Vb according to the magnitude of the input signal Va instead of keeping the output signal Vb at a certain level all the time. Hence, the AGC circuit, when used, e.g., in audio signal processing, allows an audio signal having depth and perspective in terms of audibility to be output.

Operation in this case will be described below. FIG. 9 shows the signal waveforms from components in the AGC circuit according to this modified example. For instance, suppose that the amplitude level of the input signal Va input to the variable gain amplifier block 11 rises from Va1 to Va2, as shown in FIG. 9A. In this case, as shown in FIG. 9B, the output Vc of the D/A converter 31 increases from Vc1 to Vc2. At the same time the threshold voltage goes up just by ΔVth from Vth1 to Vth2, as shown in FIG. 9C. As a result, the output signal is raised just by ΔVb from Vb1 to Vb2, as shown in FIG. 9D.

Figure 10:
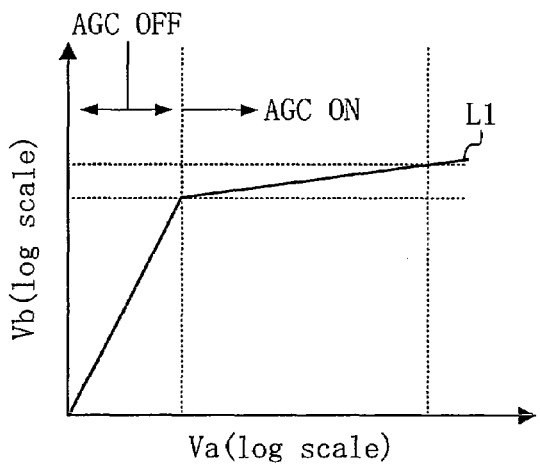
FIG. 10 is a graph indicating a correlation between an input signal to and an output signal from the AGC circuit according to the second modified example of the first embodiment of the invention.

That is, as shown in FIG. 10, even if the AGC function is in the on state, the level of the output signal rises in accordance with the level of the input signal, which makes it possible to obtain an audio signal having depth and perspective in terms of audibility.

In the configuration in which the downcount clock is changed stepwise as in the first modified example of the first embodiment, the threshold voltage Vth may also be produced based on the output Vc of the D/A converter 31. Moreover, the threshold voltage changer 51, which is a voltage amplifier in this modified example, may have any structure, so long as the threshold voltage Vth is generated based on the output Vc of the D/A converter 31.

Second Embodiment

Figure 11:
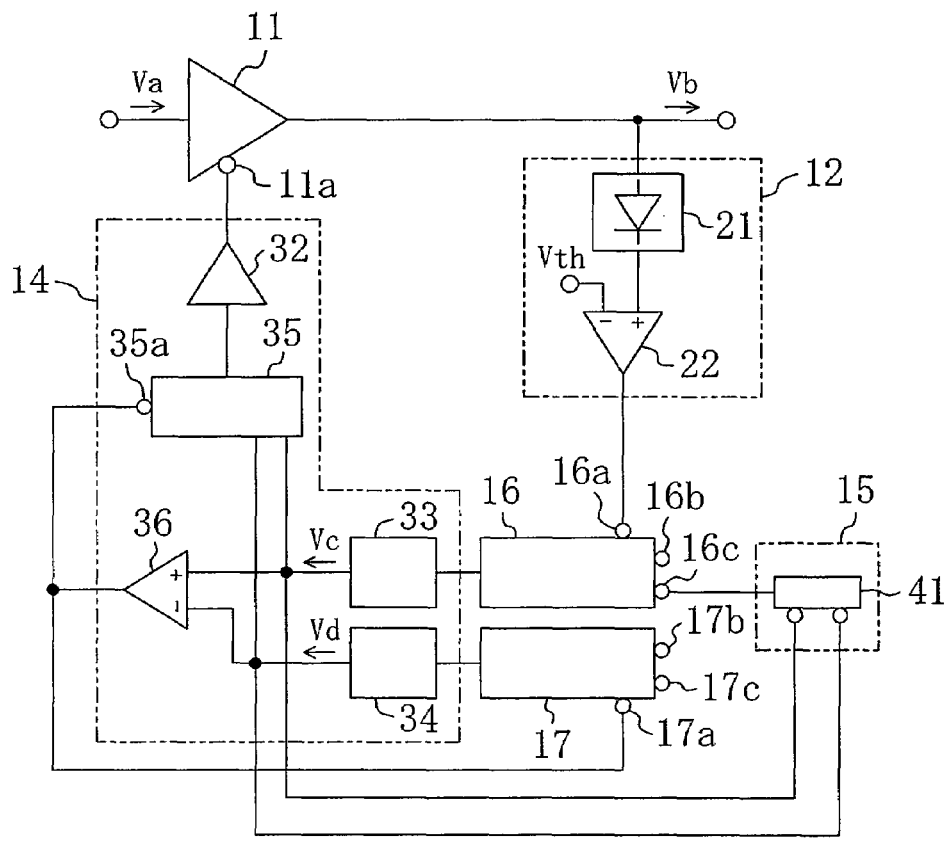
FIG. 11 is a block diagram illustrating an AGC circuit according to a second embodiment of the invention.

A second embodiment of the invention will be described with reference to the accompanying drawings. FIG. 11 illustrates the circuit configuration of an AGC circuit according to the second embodiment. The output of a variable gain amplifier block 11 whose gain varies in accordance with a voltage applied to a gain control terminal 11a is input to a count control signal generating block 12. The count control signal generating block 12 includes a rectifier 21 for detecting and rectifying the output signal of the variable gain amplifier block 11, and a threshold voltage comparator 22 for comparing the output of the rectifier 21 with a threshold voltage.

The output of the count control signal generating block 12 is connected to a first count control terminal 16a of a first up-down counter 16. When the voltage of the first count control signal applied to the first count control terminal 16a is at the high level, the first up-down counter 16 counts up in accordance with a first upcount clock input to a first upcount clock terminal 16b. When the voltage of the first count control signal is at the low level, the first up-down counter 16 counts down in accordance with a first downcount clock input to a first downcount clock terminal 16c.

The AGC circuit according to this embodiment includes a second up-down counter 17. When the voltage of a second count control signal applied to a second count control terminal 17a is at the high level, the second up-down counter 17 counts up in accordance with a second upcount clock input to a second upcount clock terminal 17b. When the voltage of the second count control signal is at the low level, the second up-down counter 17 counts down in accordance with a second downcount clock input to a second downcount clock terminal 17c.

A gain control signal generating block 14 generates a gain control signal for controlling the gain of the variable gain amplifier block 11, from the count value of the first up-down counter 16 and the count value of the second up-down counter 17. The gain control signal generating block 14 includes a first D/A converter 33 for converting the count value of the first up-down counter 16 to a voltage, and a second D/A converter 34 for converting the count value of the second up-down counter 17 to a voltage. The output of the first D/A converter 33 and the output of the second D/A converter 34 are input to a gain control signal changeover switch 35. A switch control terminal 35a of the gain control signal changeover switch 35 is connected with the output of a switching signal generator 36, which is a voltage comparator. The switching signal generator 36 compares the output of the first D/A converter 33 with the output of the second D/A converter 34. Thus, either the output of the first D/A converter 33 or the output of the second D/A converter 34, whichever is greater, is selected and output by the gain control signal changeover switch 35. The output of the gain control signal changeover switch 35 is amplified by a gain control signal amplifier 32, and the amplified output is then input to the gain control terminal 12a of the variable gain amplifier block 11.

The output of the switching signal generator 36 is also connected with the second count control terminal 17a of the second up-down counter 17. That is, the output of the switching signal generator 36 is the second count control signal. Therefore the second up-down counter 17 performs upcounting when the output of the first D/A converter 33 is greater than that of the second D/A converter 34 and performs downcounting when the output of the first D/A converter 33 is smaller than that of the second D/A converter 34.

The first downcount clock of this embodiment is generated by a downcount clock generating block 15, which is a VCO 41. The VCO 41 is controlled by a potential difference between the output of the first D/A converter 33 and the output of the second D/A converter 34. That is, as the potential difference between the output of the first D/A converter 33 and the output of the second D/A converter 34 is increased, the first downcount clock of a higher frequency is supplied. Each of the first upcount clock, the second upcount clock, and the second downcount clock is a clock pulse of a fixed frequency supplied from a clock generating block (not shown).

Hereinafter, operation of the AGC circuit according to the second embodiment will be described with reference to the accompanying drawings. In the AGC circuit of the second embodiment, the two up-down counters are used, and these up-down counters are supplied with the clocks of different frequencies as the count operation clocks. For example, in a case where the AGC circuit is used in audio signal processing, if a ripple in the detected and rectified signal remains in the gain control signal, a distortion occurs. In order to suppress this, the frequency of the second downcount clock is typically set lower than that of the signal amplified in the variable gain amplification. The upcount clocks also preferably have a frequency difference, i.e., the frequency of the first upcount clock is preferably set about 1000 times higher than that of the second upcount clock.

The first downcount clock, on the other hand, is supplied from the VCO 41. When the potential difference between the output of the first D/A converter 33 and the output of the second D/A converter 34 is close to zero, the VCO 41 generates a clock pulse whose frequency is substantially the same as that of the second downcount clock. As the potential difference is increased, the VCO 41 produces a clock pulse of a higher frequency than the second downcount clock.

Suppose a case in which a signal whose amplitude sharply increases in a time period T3 and suddenly decreases in a time period T4 as shown in FIG. 12A is input to the AGC circuit of the second embodiment. In this case, the upcounting in the first up-down counter 16 proceeds in the time period T3 as shown in FIG. 12B, whereby the output Vc of the first D/A converter 33 is increased. The output Vc of the first D/A converter 33 thus becomes higher than the output Vd of the second D/A converter 34, causing the output of the switching signal generator 36 to go to the high level. Consequently, the second up-down counter 17 also starts upcounting. However, since the frequency of the second upcount clock is lower than that of the first upcount clock, the rate of increase of the output Vd of the second D/A converter 34 is lower than that of the output Vc of the first D/A converter 33. Hence, the output of the switching signal generator 36 is kept at the high level, the gain control signal changeover switch 35 selects and outputs the output of the first D/A converter 33, and the gain of the variable gain amplifier block 11 is controlled by the output of the first D/A converter 33. As a result, a fast attack operation is performed, so that the amplitude of the output signal hardly varies as shown in FIG. 12E.

When the amplitude of the input signal Va suddenly decreases in the time period T4, the first up-down counter 16 starts downcounting. At this time, since the potential difference between the output Vc of the first D/A converter 33 and the output Vd of the second D/A converter 34 is large, the frequency of the first downcount clock supplied from the VCO 41 is higher than that of the second downcount clock as shown in FIGS. 12C and 12D. Therefore, the downcounting in the first up-down counter goes fast, which causes a sudden drop in the output Vc of the first D/A converter 33, resulting in a large increase in the gain of the variable gain amplifier block 11.

At this point in time, since the output Vc of the first D/A converter 33 is still higher than the output Vd of the second D/A converter 34, the second up-down counter 17 continues upcounting, so that the output Vd of the second D/A converter 34 keeps increasing gently. Thus the potential difference between the output Vc of the first D/A converter 33 and the output of the second D/A converter 34 narrows gradually, whereby the frequency of the first downcount clock supplied from the VCO 41 is lowered gradually. This results in a reduction in the speed of the downcounting in the first up-down counter 16 and thus in the rate of decrease of the output Vc of the first D/A converter 33. Accordingly, the increase in the gain of the variable gain amplifier block 11 gradually becomes small, which permits the output signal Vb to be restored in a smooth curve as shown in FIG. 12E rather than in a straight line.

Furthermore, when the voltage of the output Vc of the first D/A converter 33 decreases to fall below the output Vd of the second D/A converter 34, the output of the switching signal generator 36 goes to the low level, such that the gain of the variable gain amplifier block 11 is controlled by the output Vd of the second D/A converter 34. And the second up-down counter 17 also starts downcounting. At this point in time, since the frequency of the first downcount clock is substantially the same as that of the second downcount clock, the output signal Vb smoothly changes even after the gain control signal is switched to the output Vd of the second D/A converter 34. In this way, when used, e.g., in audio signal processing, the AGC circuit reduces discomfort in terms of audibility.

First Modified Example of the Second Embodiment

Figure 13:
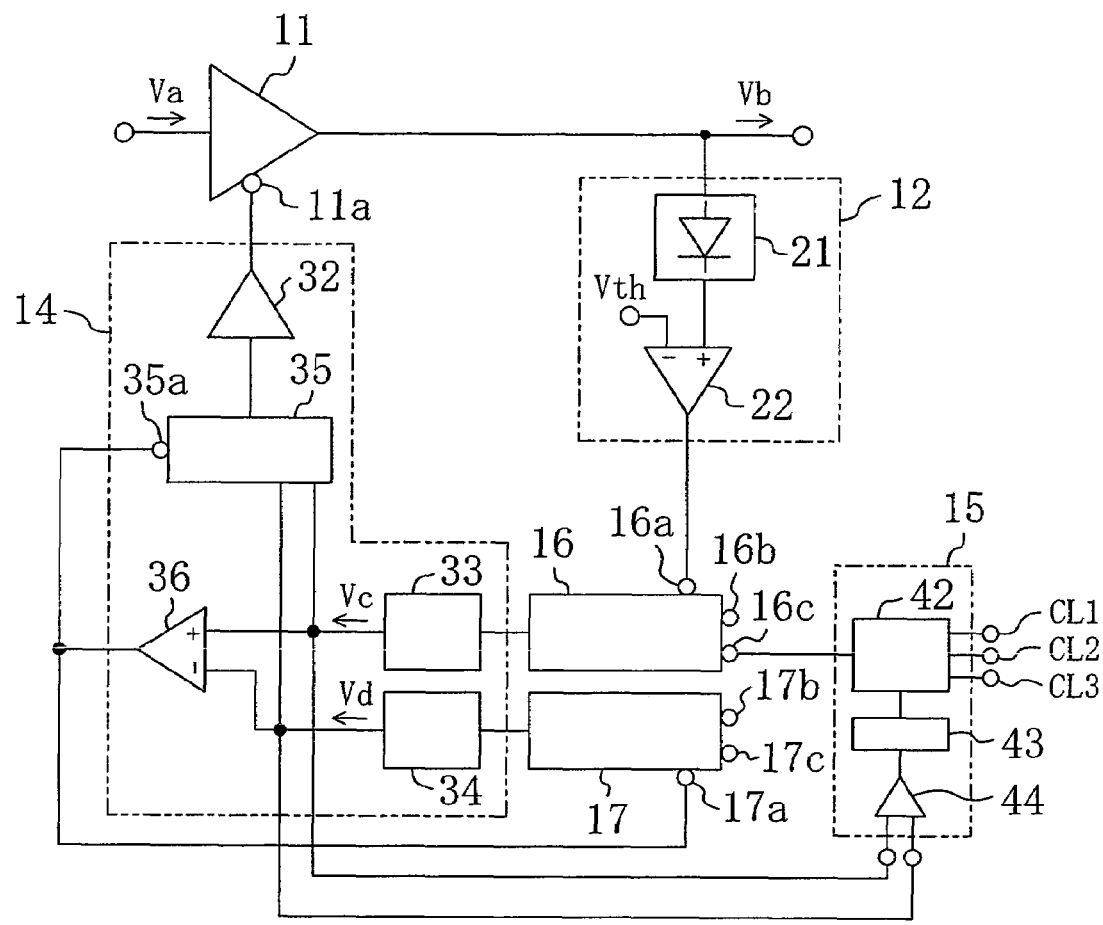
FIG. 13 is a block diagram illustrating an AGC circuit according to a first modified example of the second embodiment of the invention.

In the second embodiment, the VCO is used to change the frequency of the first downcount clock. As in the first modified example of the first embodiment, however, other configuration may be employed in which a clock changeover switch performs switching among clock pulses supplied from a clock pulse generating block (not shown) which produces the clock pulses having different frequencies. For example, as shown in FIG. 13, the downcount clock generating block 15 may include a clock signal selector switch 42, an amplifier 44 for amplifying the output of the switching signal generator 36, and an A/D converter 43 for converting the output of the amplifier 44 to digital data.

In the case of this configuration, since the downcount clock changes stepwise, changes in the waveform during recovery operation become rough, however, the effect of reducing discomfort in terms of audibility is sufficiently achievable. Also, although the frequency of the downcount clock is changed in three levels in FIG. 13, the number of switching levels may be increased to thereby allow the waveform to change more finely during recovery operation.

Moreover, any other configurations may be adopted, so long as the frequency of the first downcount clock is changed according to the difference between the count value of the first up-down counter and the count value of the second up-down counter.

Second Modified Example of the Second Embodiment

Figure 14:
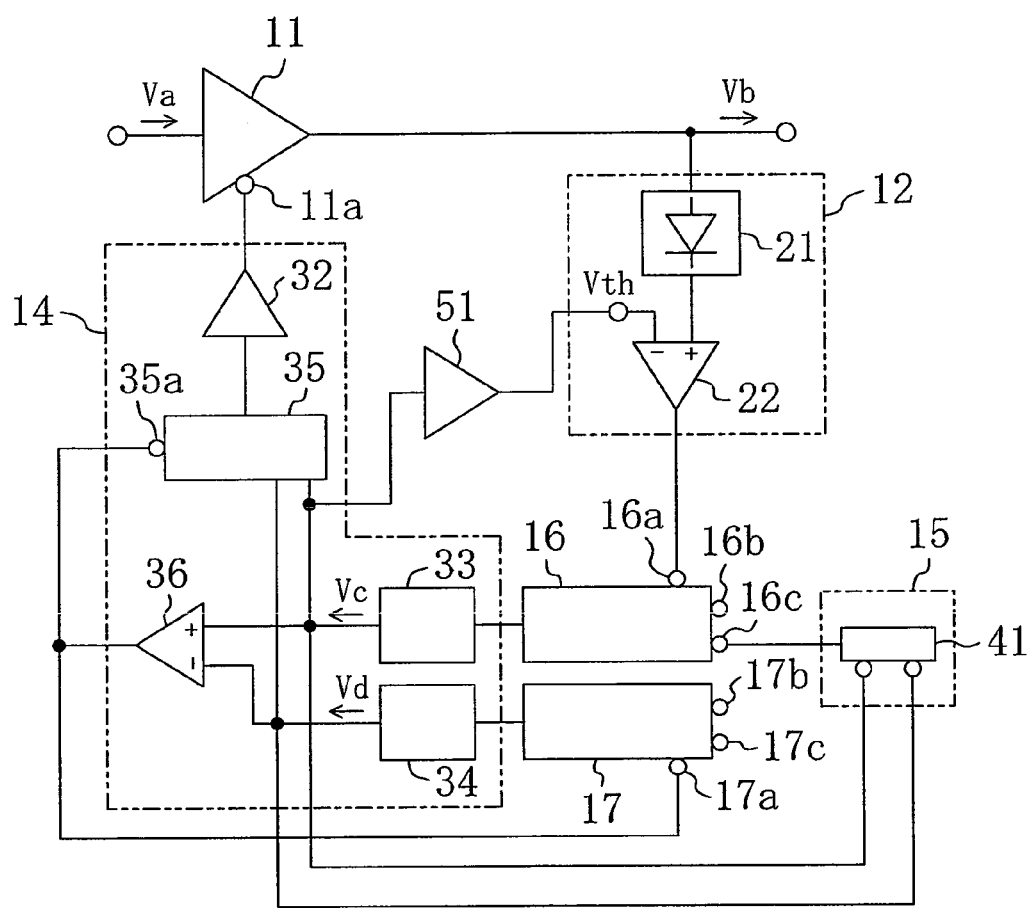
FIG. 14 is a block diagram illustrating an AGC circuit according to a second modified example of the second embodiment of the invention.

In the exemplary case described in the second embodiment, the threshold voltage for generating the count control signal is a constant voltage. Nevertheless, as in the second modified example of the first embodiment, a configuration may be adopted in which the threshold voltage is generated based on the output Vc of the first D/A converter 33. For example, as shown in FIG. 14, the output Vc of the first D/A converter 33 may be changed to a predetermined threshold voltage by a threshold voltage changer 51, which is a voltage amplifier, and then the predetermined threshold voltage may be input to the threshold voltage comparator 22. This configuration enables the threshold voltage Vth for switching between the upcount operation and the downcount operation of the first up-down counter 16 to be changed in accordance with the magnitude of the input signal. It is thus possible to change the magnitude of the output signal according to the magnitude of the input signal instead of keeping the output signal at a certain level all the time. Hence, when used in audio signal processing, for example, the AGC circuit enables an audio signal having depth and perspective in terms of audibility to be output.

Figure 15:
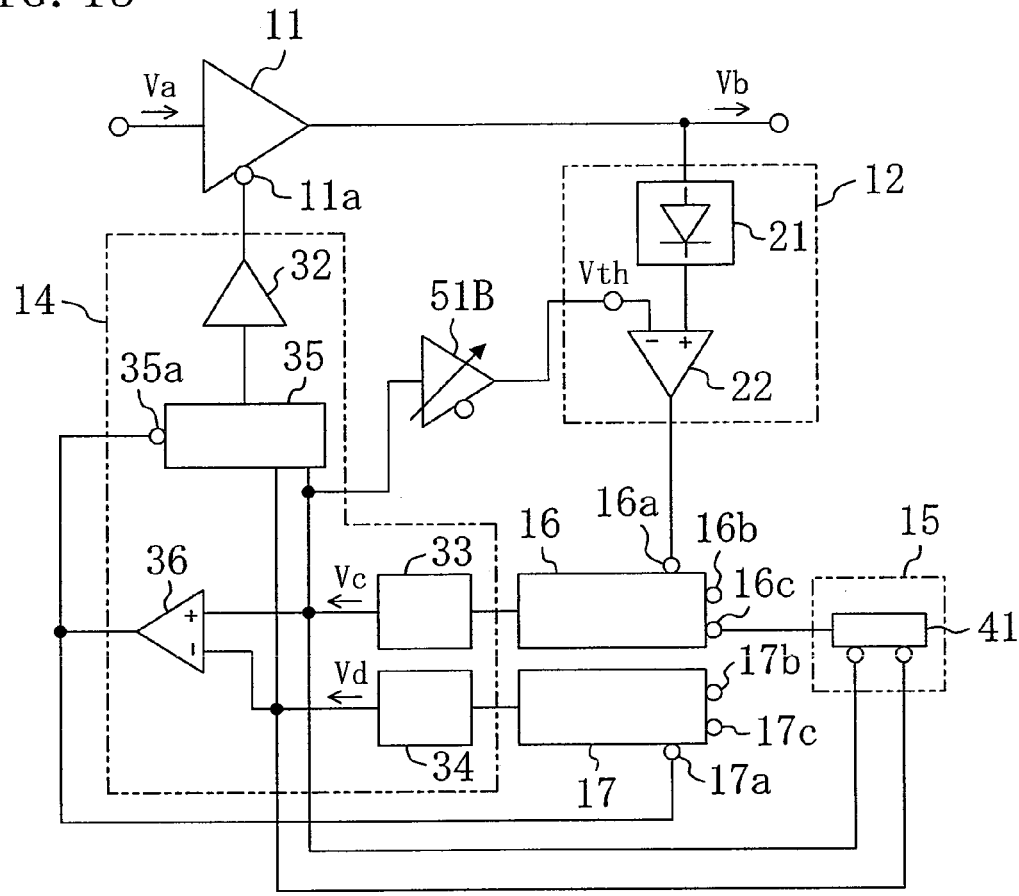
FIG. 15 is a block diagram illustrating another AGC circuit according to the second modified example of the second embodiment of the invention.

Furthermore, as shown in FIG. 15, the threshold voltage changer 51, which is a typical voltage amplifier, may be replaced with a variable amplifier 51B capable of gain control, so as to change the degree of contribution of the output Vc of the first D/A converter 33 to the threshold voltage. This makes it possible to freely set a range in which the amplitude level of the output signal is varied according to the amplitude level of the input signal while the AGC function is in the on state.

Figure 16:
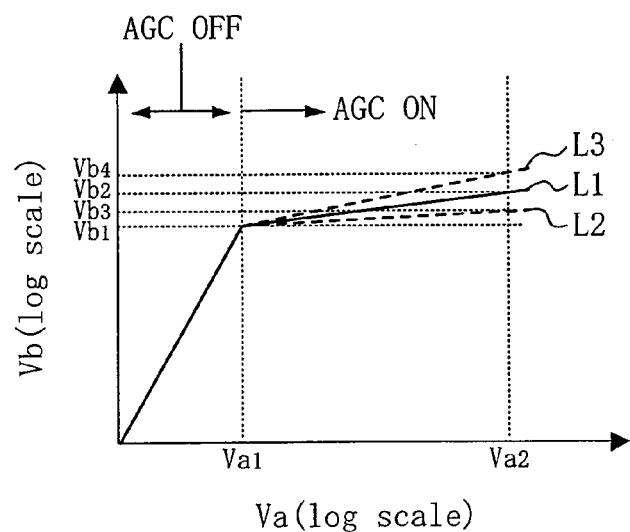
FIG. 16 is a graph indicating a correlation between an input signal to and an output signal from the AGC circuit according to the second modified example of the second embodiment of the invention.

For instance, in a case in which the variable amplifier 51B has such a gain as indicated by L1 in FIG. 16, if the input level is Va1, the output level is Vb1, and if the input level is Va2, the output level is Vb2. When it is desired to reduce the change in the output level, the gain of the variable amplifier 51B is set to L2. Then, when the input level varies from Va1 to Va2, the output level varies from Vb1 to Vb3. On the other hand, when it is desired to increase the change in the output level, the gain of the variable amplifier 51B is set to L3. Then, when the input level varies from Va1 to Va2, the output level varies from Vb1 to Vb4. In this way, a more excellent AGC circuit is realized in which it is possible to freely set a range in which the amplitude level of the output signal is varied according to the amplitude level of the input signal even when the AGC function is in the on state. It should be noted that the gain of the variable amplifier 51B may be changed in any number of levels or may be changed continuously. Furthermore, in the circuit according to the second modified example of the first embodiment, the threshold voltage changer may also be replaced with a variable amplifier.

Moreover, as described in the first modified example of the second embodiment, the VCO in the downcount clock generating block 15 may be substituted by a selector switch for selecting a clock pulse.

Third Embodiment

Figure 17:
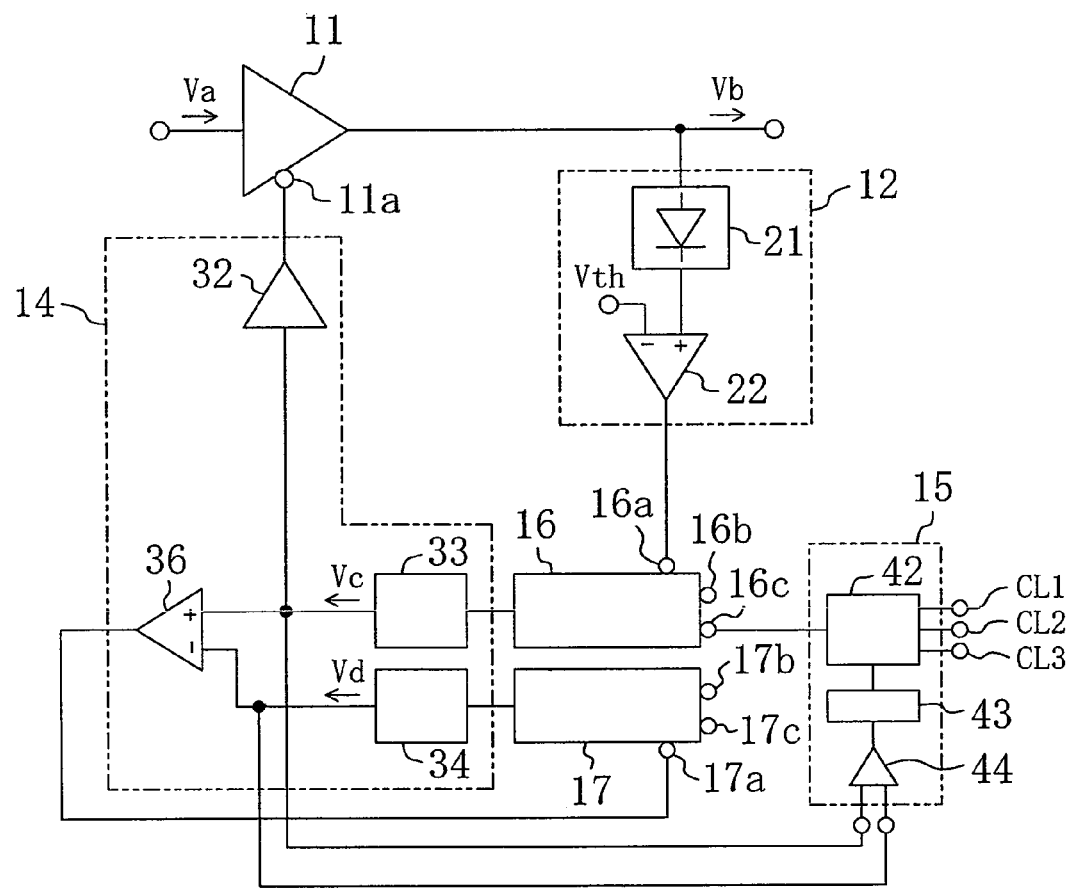
FIG. 17 is a block diagram illustrating an AGC circuit according to a third embodiment of the invention.

A third embodiment of the invention will be described with reference to the accompanying drawings. FIG. 17 illustrates the circuit configuration of an AGC circuit according to the third embodiment of the invention. In FIG. 17, the same members as those shown in FIG. 13 are identified by the same reference numerals and the description thereof will be omitted herein.

As shown in FIG. 17, the AGC circuit of this embodiment generates a gain control signal by amplifying the output Vc of a first D/A converter 33.

Switching between gain-control-signal suppliers may cause a distortion in the waveform of the gain control signal, or may cause occurrence of a signal of a frequency that was not originally input. In addition, the switching circuit for performing the signal switching may produce switching noise, etc., which may cause the waveform of the gain control signal to become distorted or an abnormal signal to occur. Nevertheless, the AGC circuit of this embodiment does not need an output selector, and is thus capable of suppressing distortion in the waveform of the gain control signal and occurrence of an abnormal signal. Furthermore, the more excellent AGC circuit is achieved which enables the waveform of the output signal to form a smooth curve during recovery operation.

Figure 18:
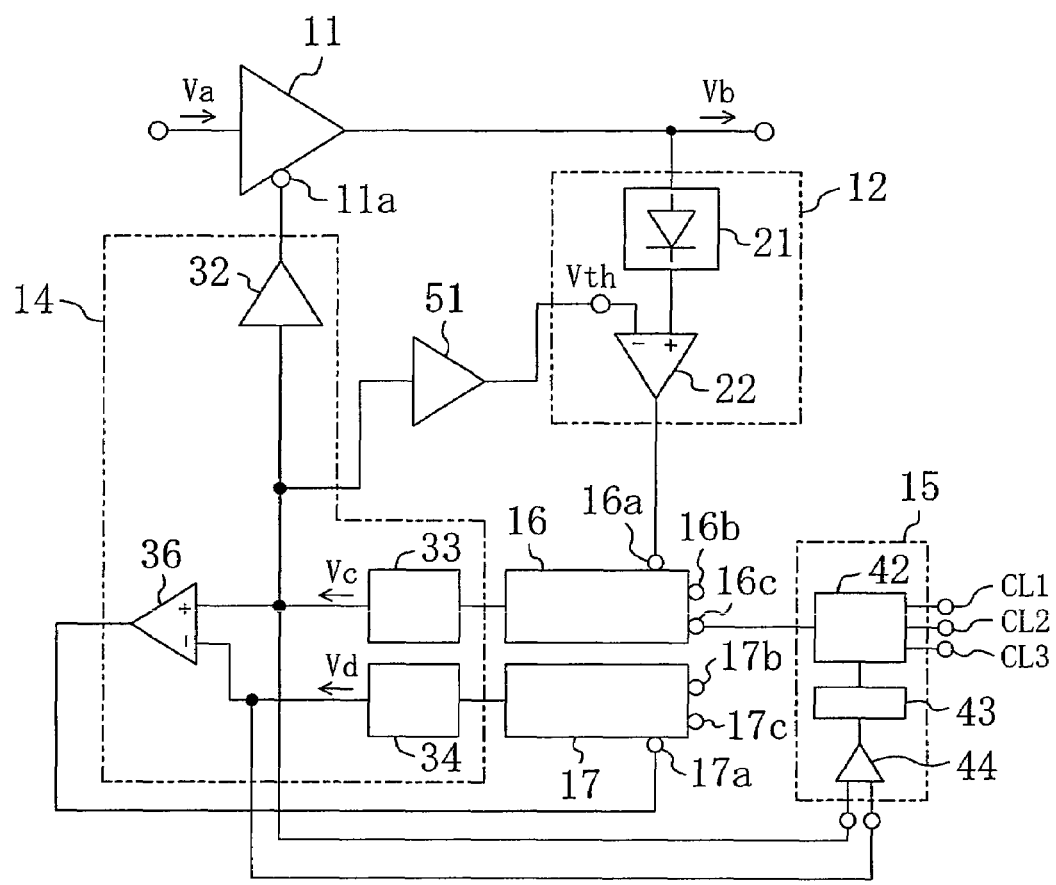
FIG. 18 is a block diagram illustrating an AGC circuit according to a modified example of the third embodiment of the invention.

In the AGC circuit of the third embodiment, the threshold voltage Vth may also be produced from the output Vc of the first D/A converter 33 as shown in FIG. 18. In this case, the threshold voltage changer 51 may be a variable amplifier capable of gain control. And the downcount clock generating block 15 may be a VCO.

Fourth Embodiment

Figure 19:
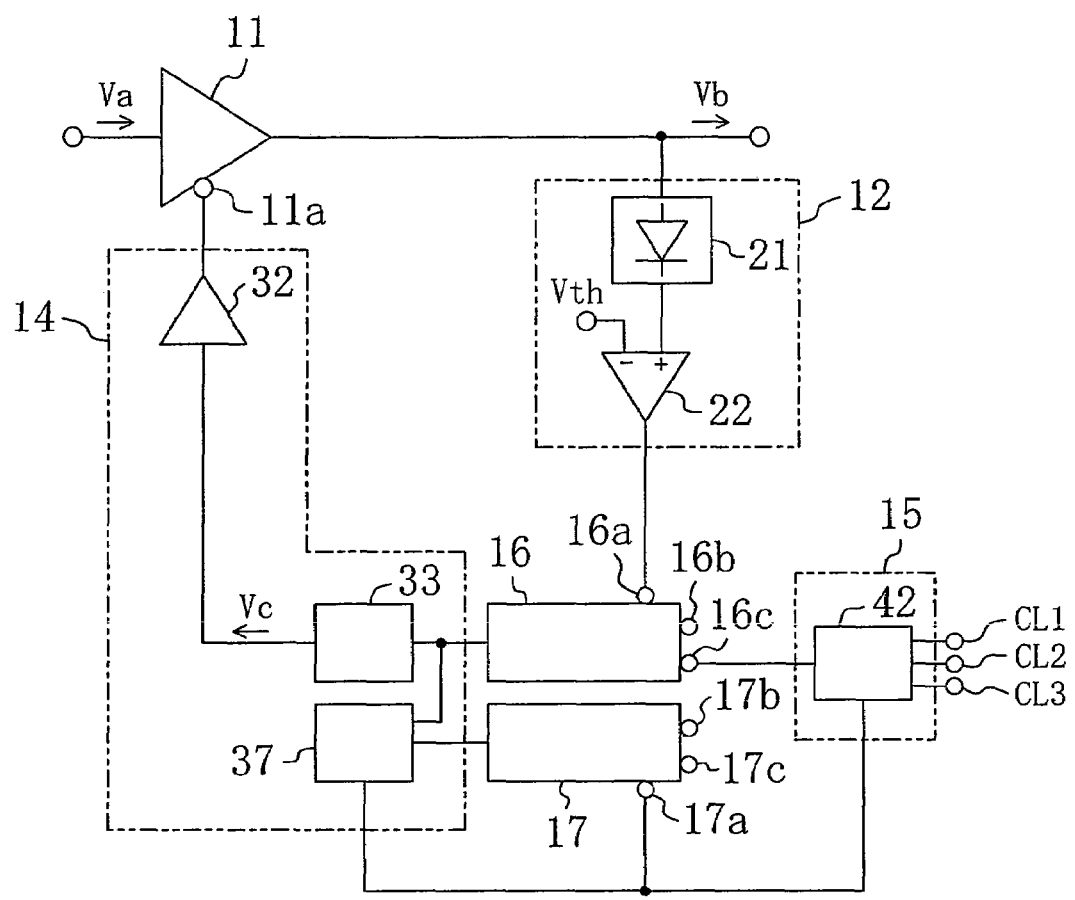
FIG. 19 is a block diagram illustrating an AGC circuit according to a fourth embodiment of the invention.

A fourth embodiment of the invention will be described with reference to the accompanying drawings. FIG. 19 illustrates the circuit configuration of an AGC circuit according to the fourth embodiment. In FIG. 19, the same members as those shown in FIG. 17 are identified by the same reference numerals and the description thereof will be omitted herein.

As shown in FIG. 19, in the AGC circuit of this embodiment, a signal input to a second count control terminal 17a of a second up-down counter 17 is generated by an arithmetic circuit 37 which outputs, as digital data, a difference between the output of a first up-down counter 16 and the output of the second up-down counter 17. And a first downcount clock is changed stepwise by switching a clock signal selector switch 42 by the digital data generated by the arithmetic circuit 37.

This circuit configuration eliminates the need for a second D/A converter and a voltage comparator. And an amplifier and an A/D converter for driving the clock signal selector switch 42 are also become unnecessary, thereby achieving cost reduction and space saving.

Figure 20:
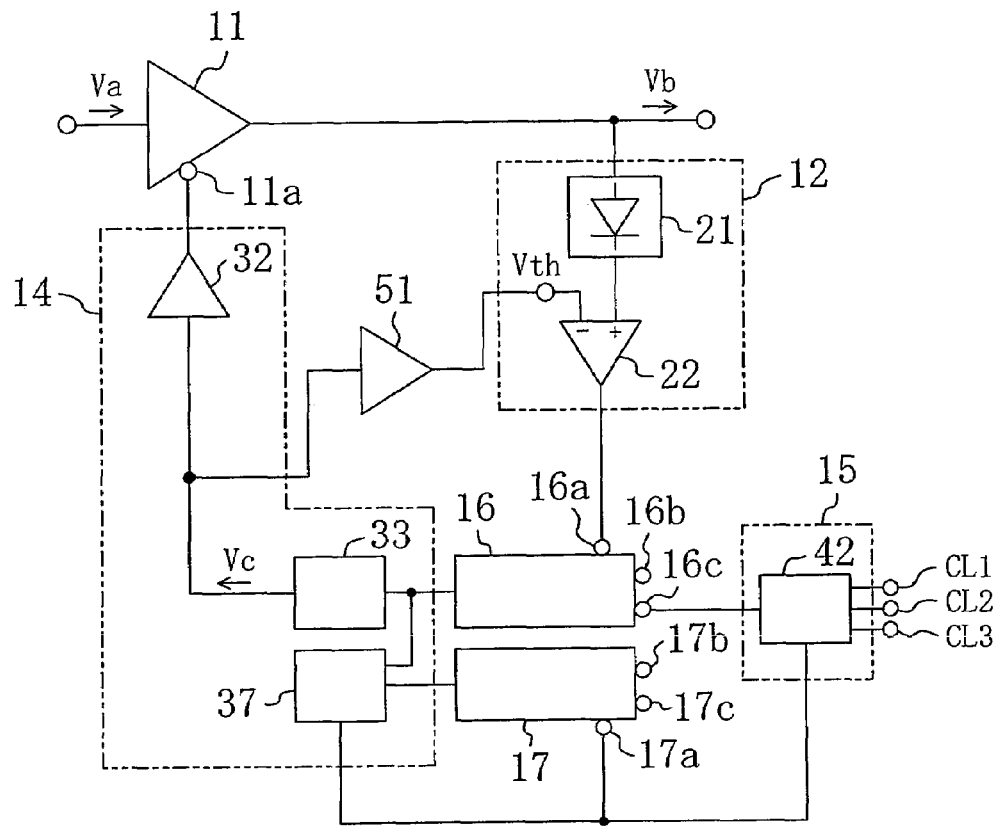
FIG. 20 is a block diagram illustrating an AGC circuit according to a modified example of the fourth embodiment of the invention.
Figure 21:
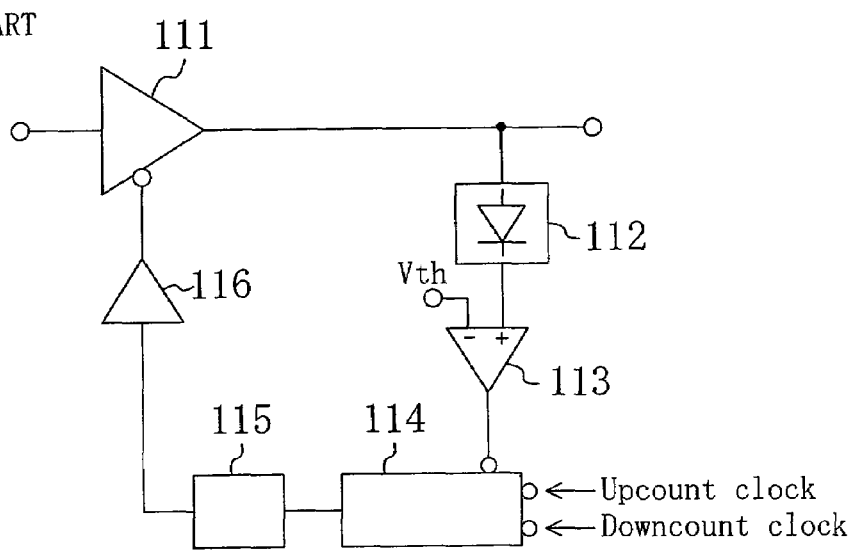
FIG. 21 is a block diagram illustrating a conventional AGC circuit.
Figure 22A:
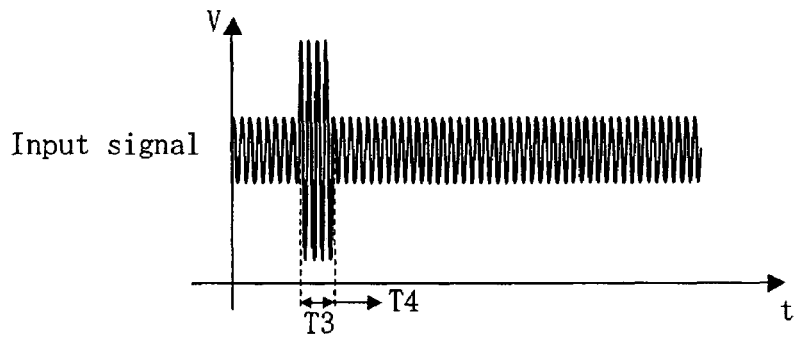
FIGS. 22A to 22E are graphs indicating signal waveforms from components in the conventional AGC circuit.
Figure 22B:
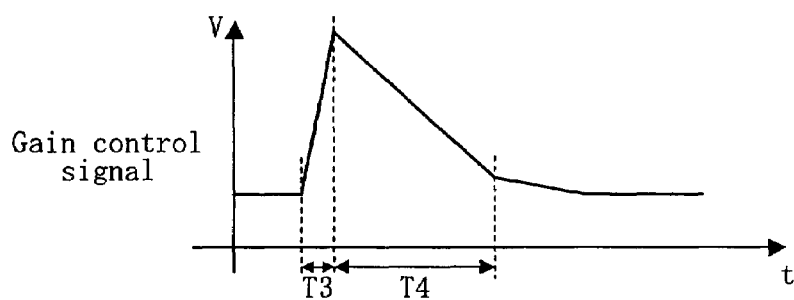
Figure 22C:
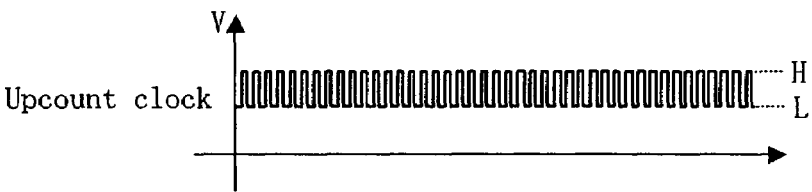
Figure 22D:
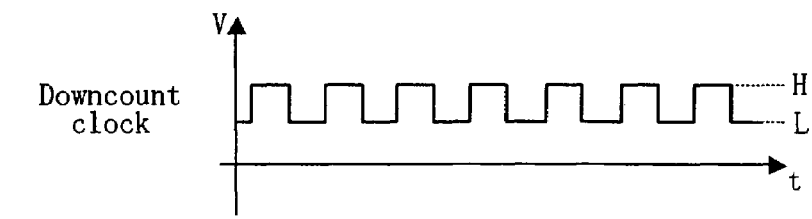
Figure 22E:
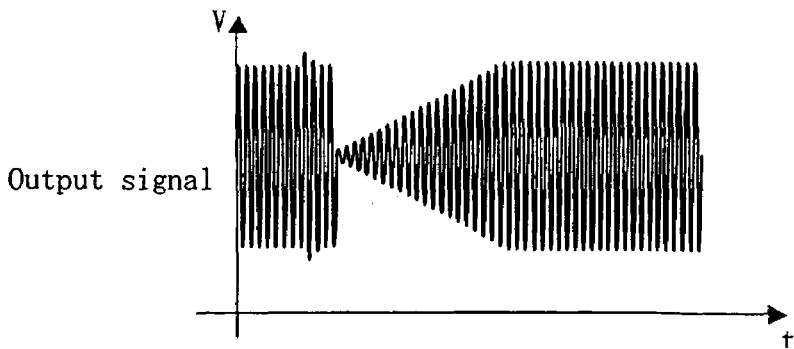

Also, as shown in FIG. 20, a threshold voltage changer 51 may be provided so as to produce a threshold voltage Vth based on the output Vc of a first D/A converter 33. In this case, the threshold voltage changer 51 may be a variable amplifier capable of gain control. And a downcount clock generating block 15 may be a VCO or the like, which is controlled by the output Vc of the first D/A converter 33.

In the exemplary cases described in the foregoing embodiments and in the modified examples, the gain of the variable gain amplifier block 11 is controlled by a voltage system. However, the gain control system for the variable gain amplifier block 11 may be other system, such as a current system. In that case, the circuit configurations of a D/A converter and a gain control signal generating block for converting the count value of an up-down counter to a gain control signal may be changed as necessary.

Although there have been described herein the specific embodiments of the invention, the invention is in no way limited to these illustrative embodiments. It will be understood that many changes and modifications may be made therein without departing from the scope of the invention.

As described above, the automatic gain control circuits according to the invention, which do not need an integrator using a capacitor and which are more excellent in terms of audibility, are applicable, e.g., to automatic gain control circuits, provided in communication systems or in audio systems, for controlling the gain of a variable gain amplifier circuit in accordance with the amplitude of an input signal.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. An automatic gain control circuit for generating a gain control signal for controlling the gain of a variable gain amplifier block in accordance with an output of the variable gain amplifier block, the automatic gain control circuit comprising:
a count control signal generating block for generating a count control signal according to the output of the variable gain amplifier block;
an up-down counter for upcounting an upcount clock signal or downcounting a downcount clock signal according to the count control signal;
a gain control signal generating block for generating the gain control signal corresponding to a count value of the up-down counter; and
a downcount clock signal generating block for generating the downcount clock signal whose frequency corresponds to the count value of the up-down counter, wherein:
the gain control signal generating block includes a digital-to-analog converter for converting the count value of the up-down counter to a voltage, and
the downcount clock signal generating block is a voltage controlled oscillator whose oscillation frequency is controlled by an output of the digital-to-analog converter.

2. The automatic gain control circuit of claim 1, wherein the gain control signal generating block includes a gain control signal amplifier for amplifying an output of the digital-to-analog converter.

3. The automatic gain control circuit of claim 1, wherein the downcount clock signal generating block has a selector switch for selecting, as the downcount clock signal, one of a plurality of clock pulses of different frequencies in accordance with the count value of the up-down counter.

4. The automatic gain control circuit of claim 3, wherein the downcount clock signal generating block has an analog-to-digital converter for generating digital data corresponding to an output of the digital-to-analog converter; and
the selector switch is controlled by an output of the analog-to-digital converter.

5. The automatic gain control circuit of claim 1, wherein the count control signal generating block has a rectifier circuit for rectifying the output of the variable gain amplifier block; and
a threshold voltage comparator for comparing an output of the rectifier circuit with a threshold voltage to output a result of the comparison as the count control signal.

6. The automatic gain control circuit of claim 5, wherein the threshold voltage is determined based on the count value of the up-down counter.

7. The automatic gain control circuit of claim 6, further comprising a threshold voltage changer for changing an output of the digital-to-analog converter to the threshold voltage.

8. An automatic gain control circuit for generating a gain control signal for controlling the gain of a variable gain amplifier block in accordance with an output of the variable gain amplifier block, the automatic gain control circuit comprising:
a count control signal generating block for generating a first count control signal according to the output of the variable gain amplifier block;
a first up-down counter for upcounting a first upcount clock signal or downcounting a first downcount clock signal according to the first count control signal;
a second up-down counter for upcounting a second upcount clock signal or downcounting a second downcount clock signal according to a second count control signal;
a gain control signal generating block for generating the gain control signal and the second count control signal in accordance with a count value of the first up-down counter and a count value of the second up-down counter; and
a downcount clock signal generating block for generating the first downcount clock signal whose frequency corresponds to a difference between the count value of the first up-down counter and the count value of the second up-down counter, wherein:
the gain control signal generating block generates the second count control signal in accordance with a result of a comparison between the count value of the first up-down counter and the count value of the second up-down counter, and generates the gain control signal according to the count value of the first up-down counter, and
the gain control signal generating block includes:
a first digital-to-analog converter for converting the count value of the first up-down counter to a voltage to generate the gain control signal; and
an arithmetic circuit for performing a comparison operation between the count value of the first up-down counter and the count value of the second up-down counter, thereby generating the second count control signal.

9. The automatic gain control circuit of claim 8, wherein the downcount clock signal generating block has a selector switch for selecting, as the first downcount clock signal, one of a plurality of clock pulses of different frequencies in accordance with an output of the arithmetic circuit.

10. An automatic gain control circuit for generating a gain control signal for controlling the gain of a variable gain amplifier block in accordance with an output of the variable gain amplifier block, the automatic gain control circuit comprising:
a count control signal generating block for generating a first count control signal according to the output of the variable gain amplifier block;
a first up-down counter for upcounting a first upcount clock signal or downcounting a first downcount clock signal according to the first count control signal;
a second up-down counter for upcounting a second upcount clock signal or downcounting a second downcount clock signal according to a second count control signal;
a gain control signal generating block for generating the gain control signal and the second count control signal in accordance with a count value of the first up-down counter and a count value of the second up-down counter; and
a downcount clock signal generating block for generating the first downcount clock signal whose frequency corresponds to a difference between the count value of the first up-down counter and the count value of the second up-down counter,
wherein the gain control signal generating block includes a first digital-to-analog converter for converting the count value of the first up-down counter to a voltage, and a second digital-to-analog converter for converting the count value of the second up-down counter to a voltage; and the downcount clock signal generating block is a voltage controlled oscillator whose oscillation frequency is controlled by a voltage difference between an output of the first digital-to-analog converter and an output of the second digital-to-analog converter.

* * * * *